United States Patent [19]

Gittins et al.

[11] E Patent Number: Re. 32,314

[45] Reissued Date of Patent: Dec. 23, 1986

[54] FREQUENCY CONTROL CIRCUITS SUCH AS FOR USE IN MODULATION MEASUREMENT

[75] Inventors: Derek R. Gittins, Wokingham; Michael D. Gregory, Windsor, both of England

[73] Assignee: Racal-Dana Instruments Limited, England

[21] Appl. No.: 958,943

[22] Filed: Nov. 8, 1978

Related U.S. Patent Documents

Reissue of:

[64] Patent No.: 3,992,670
Issued: Nov. 16, 1976
Appl. No.: 565,017
Filed: Apr. 3, 1975

[30] Foreign Application Priority Data

May 21, 1974 [GB] United Kingdom ..... 22510/74

[51] Int. Cl.[4] ..... H04B 17/00

[52] U.S. Cl. ..... 455/115; 455/226; 455/263

[58] Field of Search ..... 325/67, 133, 134, 363, 325/416–423, 346, 433; 455/67, 115, 161, 208, 260, 265; 358/195.1; 331/17, 18, 23; 324/78 Z, 79 R

[56] References Cited

U.S. PATENT DOCUMENTS

| | | | |
|---|---|---|---|
| 3,512,089 | 5/1970 | Cushman | 325/363 |
| 3,569,938 | 3/1971 | Blair | 325/423 |
| 3,649,919 | 3/1972 | Fridman et al. | 325/418 |
| 3,736,510 | 5/1973 | Wu | 325/134 |
| 3,753,141 | 8/1973 | Van Elk et al. | 331/17 |

OTHER PUBLICATIONS

"Racal Review", pp. 4 & 16, 3/1974.
Publication on Sayrosa Model 251 Automatic Modulation Meter (1972), 2 pages.
Publication on Sayrosa Model 252 Automatic Modulation Meter 5/7/74, 2 pages.
Hewlett Packard Journal (1973), pp. 1–24.
Instruction Manual for Eddystone Radio Model EC 958/12, Nov. 1, 1974.
Instruction Manual for FM/AM Modulation Meter TF2300B, 4/26/74.
Maintenance Manual for Model 9009 AM/FM Modulation Meter, 10/1975.
Microdot Inc. "Model 412 FM Signal Generator–Operation and Maintenance Manual", Jun. 1, 1962.
"Calibrating Mobile Radios" by D. R. Gittens, Jul. 27, 1972.
"New Product Information" on Modulation Meter 9009 by Racal, Jul. 19, 1973.
"New Product Release" on Modulation Meter 9009 by Racal, Oct. 25, 1973.
"Backup Services are also Mobile" by D. R. Greasey, Electronics Weekly, Nov. 7, 1973.
"CATC Electronics News" Relating to Racal Modulation Meter 9009, Dec. 1973.
Irish Patent Application No. 916/73, Laid Open to Public Inspection in Dec. 1973.
"Operating & Service Instructions Issue 1" by Pye Telecommunications Limited, Cambridge, England, 1973.
Schematic of "Eddystone Radio", 1974.
Modulation Meter Type TF2300 Instruction Manual by Marconi Instruments, 1966.
Hewlett-Packard Co. Service Manual on Model 8405 A Vector Voltmeter, 1966.
Hewlett-Packard Co. Application Note 91, Jan. 1968.

*Primary Examiner*—Jin F. Ng
*Attorney, Agent, or Firm*—Leydig, Voit & Mayer

[57] ABSTRACT

A circuit responsive to an input signal having an unspecified frequency for converting it to a predetermined and constant means frequency, and particularly suitable for incorporation in a modulation measuring instrument, comprises a sampling mixer controlled by a variable frequency oscillator for sampling the input signal to produce an intermediate signal. The mean frequency of the intermediate signal is then compared with a reference representing a predetermined frequency value whereby to produce an error signal, and means responsive to the error signal adjusts the frequency of the oscillator in such a direction as to tend to hold the mean value of the frequency of the intermediate signal at the predetermined frequency value while preserving therein variations in amplitude and/or frequency due to amplitude and/or frequency modulation.

14 Claims, 6 Drawing Figures

FREQUENCY CONTROL CIRCUITS SUCH AS FOR USE IN MODULATION MEASUREMENT

Matter enclosed in heavy brackets [ ] appears in the original patent but forms no part of this reissue specification; matter printed in italics indicates the additions made by reissue.

The invention relates to electrical circuit arrangements. More particularly, it relates to circuit arrangements responsive to an input signal having a frequency anywhere within a predetermined range of frequencies for producing an output frequency having a predetermined and substantially constant means frequency; such a circuit arrangement may, for example, be used in a system for measuring the degree of modulation of a modulated signal (whether modulated by amplitude modulation or by frequency modulation).

According to the invention, there is provided an electrical circuit arrangement responsive to an input signal whose frequency lies within a predetermined range and for converting the input signal to a predetermined mean frequency, comprising mixing means for mixing the input signal with a variable frequency signal so as to produce an intermediate signal whose frequency is algebraically dependent on the two mixed frequencies, discriminator means responsive to the frequency of the intermediate signal to produce a control signal whose magnitude is dependent on the frequency of the intermediate signal, integrator means responsive to the control signal for comparing it with the magnitude of a reference signal so as to produce an error signal dependent on the difference therebetween and integrating the error signal, and frequency control means responsive to the integrated error signal for controlling the variable frequency signal in such a direction as to bring the mean frequency of the said intermediate signal to a value represented by the reference magnitude.

According to the invention, there is further provided a modulation measurement circuit arrangement for measuring the degree of amplitude or frequency modulation of a modulated input signal, comprising means responsive to an input signal carrying the modulation to be measured to produce therefrom an intermediate signal having a controlled and predetermined mean frequency and level but in which the said amplitude or frequency modulation is preserved, and means operative to measure the envelope amplitude or frequency variations of the intermediate signal due to the modulation to be measured.

According to the invention, there is also provided a modulation measurement circuit arrangement responsive to an input signal for measuring the degree of amplitude and/or frequency modulation thereof, comprising a sampling mixer connected to receive the input signal and operative at a frequency determined by controllable-frequency oscillating means to repeatedly sample and temporarily store the amplitude of the input signal whereby to produce an intermediate signal having a mean frequency dependent on the difference between the frequency of the input signal and some multiple of the frequency of the oscillating means, means for comparing the means frequency of the said intermediate signal with a reference representing a predetermined frequency value whereby to produce a first error signal, means responsive to the error signal to adjust the frequency of the oscillating means in such a direction as to tend to hold the mean value of the frequency of the intermediate signal at the predetermined frequency value while preserving therein variations in amplitude and/or frequency due to amplitude and/or frequency modulation, means responsive to the controlled intermediate signal from the mixer to detect changes in its mean level from a predetermined reference level whereby to produce a second error signal, level changing means responsive to the second error signal to adjust the mean level of the intermediate signal from the mixer in a direction tending to reduce the second error signal to zero whereby to produce an output signal whose mean frequency and level are substantially constant at predetermined values but in which are preserved the amplitude and/or frequency variations due to amplitude and/or frequency modulation in the input signal, and selectively controllable measuring means for detecting the amplitude or frequency modulation in the output signal and measuring the levels thereof.

Electrical circuit arrangements embodying the invention and for measuring the degree of amplitude or frequency modulation of a modulated input signal will now be described, by way of example only, with reference to the accompanying drawings in which.

Basically, the circuit arrangements to be described accept a modulated input signal whose modulation depth (if amplitude modulated) or frequency deviation (if frequency modulated) is to be determined, uses a "sample and hold" mixing technique to produce a predetermined low frequency i.f. signal carrying the modulation information, controls the average level of the i.f. signal, and then measures the degree of modulation of the so-controlled signal.

Figure 1:
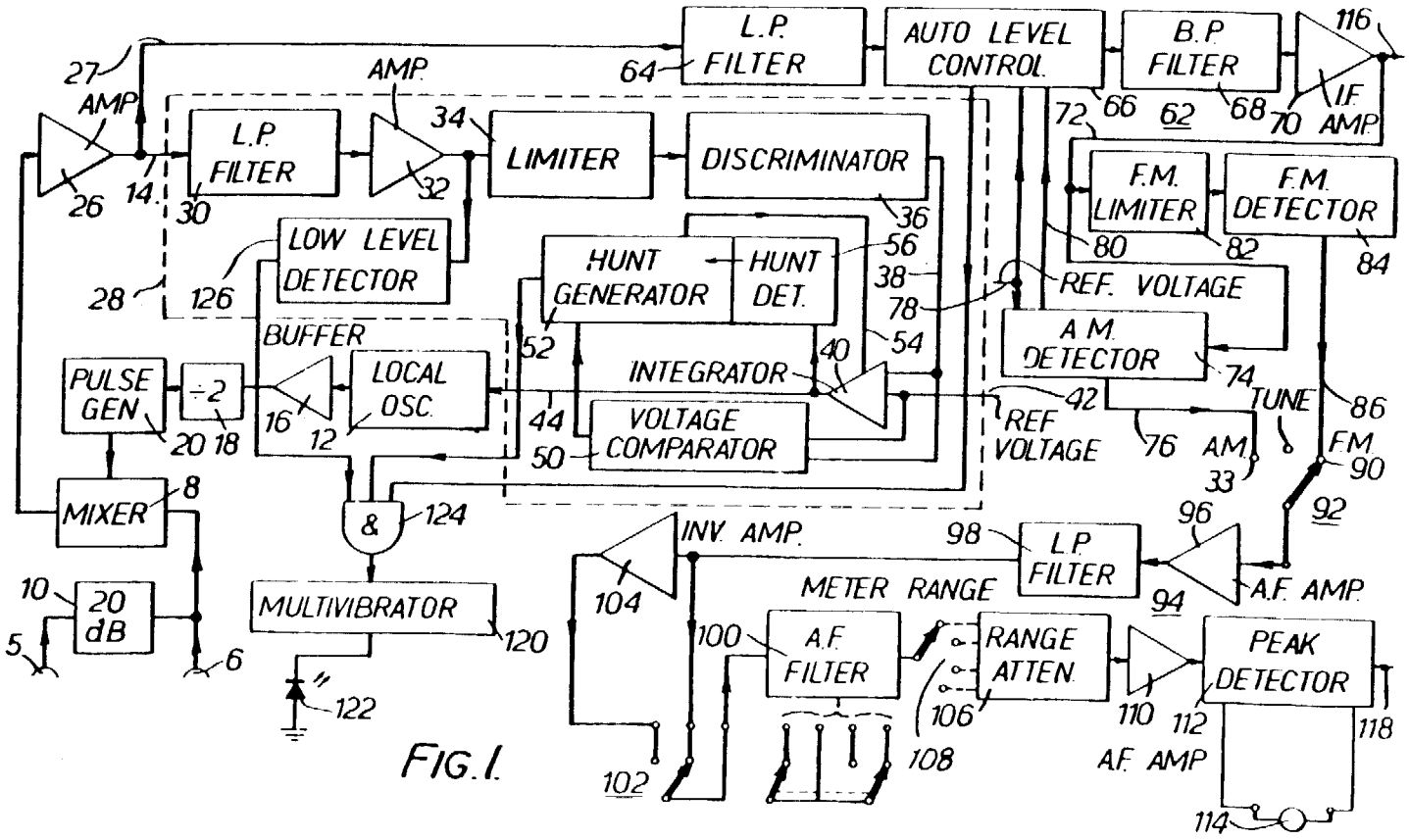
FIG. 1 is a schematic circuit diagram of one form of the arrangement.

The circuit arrangement of FIG. 1 has two alternative inputs, a high level input 5 and a low level input 6. The latter is connected directly to one input of a mixer 8, while the input 5 is connected to the mixer 8 through an attenuator 10 giving a fixed degree (20 dB) of attenuation.

In the mixer 8, the input signal is mixed with an output derived from a variable-frequency oscillator 12, and in a manner to be described, the frequency of the oscillator 12 is controlled so that the mixer output, on a line 14, has a predetermined, low, intermediate frequency (i.f.).

The output of the oscillator 12 is fed to a second input of the mixer 8 through a buffer amplifier 16, a frequency divider 18 (dividing the frequency by 2), then converted into narrow pulses in a pulse generator 20, and finally applied to the mixer 8.

Figure 2:
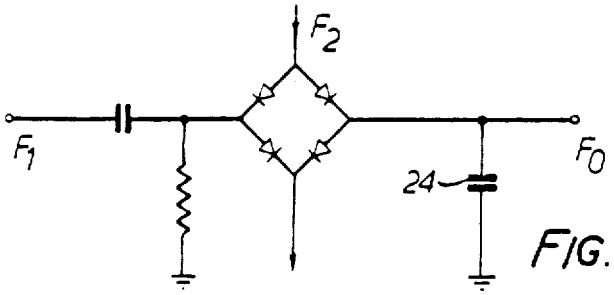
FIG. 2 is a schematic circuit diagram of a type of mixer which may be used in the circuit arrangement of FIG. 1.
Figure 3:
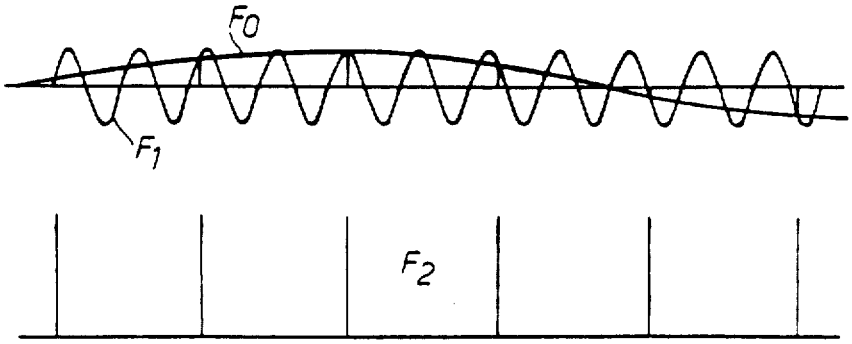
FIG. 3 shows waveforms occurring in the mixer of FIG. 2.

The mixer 8 operates according to a sample and hold technique. In accordance with this technique, the input waveform $F_1$ (FIG. 3) is repeatedly sampled at the pulse frequency ($F_2$). FIG. 2 shows, somewhat simplified, one form which the mixer 8 can take. Each sampled amplitude of the input frequency $F_1$ is temporarily stored on a capacitor 24, and the stored level therefore varies according to the difference in frequency between $F_1$ and $F_2$. The result is the production of a low frequency i.f. output signal $F_0$ (where $F_0=F_1-nF_2$, n being an integer) whose idealised shape is shown in FIG. 3 and which is applied via an amplifier 26 (FIG. 1) to feed an output line 14. The signal $F_0$ is then passed via an output line 27 to level control circuitry to be described later.

The system includes circuitry 28 for tuning the oscillator 12 so as to maintain the i.f. signal at a constant frequency (as far as average variations are concerned—variations due to frequency modulation are not corrected for and thus appear on the i.f. output as will be explained). The circuitry 28 receives the i.f. signal $F_0$ via the line 14 and includes a low pass filter 30, an amplifier 32, a limiter circuit 34 which removes amplitude information from the i.f. signal, and a discriminator circuit 36 which produces an output voltage on a line 38 proportional to the frequency of the i.f. signal.

The voltage on the line 38 is fed into one input of an integrator circuit 40 which also receives a reference voltage on a line 42 representing a predetermined value (in this case, 500 kHz) at which it is desired to control the average frequency of the i.f. signal. The output voltage of the integrator 40, on a line 44, tunes the oscillator 12 and is an integrated error signal which varies according to the difference between the voltages on the lines 38 and 42. If the i.f. frequency is drifting upwards, for example, then the voltage on line 38 will also increase. This will cause the output of the integrator 40 to fall slowly, thus decreasing the frequency of the local oscillator 12 and bringing the i.f. frequency back to the predetermined value. If the i.f. frequency drifts downwards, then the reverse action takes place.

It will be appreciated that the action of the integrator 40 is such that the circuitry 28 cannot follow rapid changes in frequency of the input due to frequency modulation, and the f.m. information is therefore not removed and exists on [the comparator 50 generates a second error signal which activates a sweep control means in the form of a hunt generator 52. By means] *line 27. This means, however, that the system as so* far described, cannot react quickly to an input when it is first applied. In order to deal with this point, the system includes a voltage comparator 50 which compares the voltage levels on the lines 38 and 42. When the voltage difference is such as to indicate that the frequency of the i.f. signal is substantially different from the predetermined value, the comparator 50 [activates] *generates a second error signal which activates a sweep control means in the form of* a hunt generator 52. By means of a line 54, the latter so controls the output of the integrator 40 that, independently of the values of its inputs on the lines 38 and 42 at that time, it sweeps the frequency of the oscillator 12 through its range. When the voltage comparator 50 determines that the changing i.f. frequency approaches the predetermined value, it switches off the hunt generator 52 which then allows the integrator 40 to take over control in the manner explained above.

The hunt generator 52 can consist of two transistors connected to produce, when switched on, positive and negative currents, for driving the integrator 40 in the upward and downward directions, respectively, together with a control circuit responsive to the sign of the output of the voltage comparator 50 for switching one or other of the two transistors on.

The circuitry also includes a hunt detector 56. The hunt detector monitors the output of the integrator 40 and incorporates level detecting circuitry for detecting when the integrator output reaches predetermined upper or lower limits. If the integrator output is detected as reaching the predetermined upper limits, the hunt detector activates the hunt generator 52 to reset the output of the integrator to a low level and then to sweep it upwardly therefrom. Again, if the oscillator output is detected as reaching the predetermined lower limit, the hunt detector activates the hunt generator to sweep the integrator output upwards until the correct lock point is reached. The integrator output may reach the upper or lower limit due for example to the oscillator output having overshot the control point or to a sudden change in the frequency of the input signal. In either case the hunt detector 52 helps the integrator to re-assume control.

As a result of the control action of the circuitry 28, therefore, the i.f. signal on the line 27 has a predetermined frequency but still carries the original modulation information (whether amplitude modulation or frequency modulation). This signal is applied to level changing means in the form of level control circuitry 62.

The circuitry 62 includes a low pass filter 64, a controllable gain amplifier 66, a band pass filter 68, and an i.f. amplifier 70. The amplified output from the amplifier 70 is applied on a line 72 to an amplitude modulation detector 74. In the a.m. detector 74, changes in the envelope of the amplified output signal on the line 72 are detected and output on a line 76. In addition, however, the average envelope amplitude is compared with a reference voltage on a line 78, and any changes produce variations in a control signal on a line 80 which adjusts the gain of the amplifier 66 in an offsetting direction. In this way, the average level of the signal on the line 72 is held constant though variations due to amplitude modulation (if any) are not removed and remain present on line 72.

The signal on the line 72 is also applied to a limiter circuit 82, which removes the amplitude information and the resultant signal is then applied to an f.m. detector 84 which produces an output voltage on a line 86 dependent on the value of the frequency modulation (if any). There thus respectively appear, at terminals 88 and 90, the amplitude and frequency modulation of the original input signal.

By means of a switch 92, either the amplitude or the frequency modulation can be applied to a measuring circuit 94. The measuring circuit includes an audio frequency amplifier 96 and a low pass filter 98. The output of the filter 98 can either be applied directly to an adjustable audio frequency filter 100 or, under control of a switch 102, applied thereto via an inverting amplifier 104. The filtered output is then applied through a range selecting adjusting attenuator circuit 106 (controlled by a range selecting switch 108) and thence through an audio frequency amplifier 110 and a peak detector 112 to a meter 114. The latter therefore indicates the extent of the amplitude or frequency modulation on the original input signal, according to the setting of the switch 92.

An output line 116 renders the signal on the line 72 externally available for extra processing if desired. Similarly, a line 118 renders the measured modulation externally available for recording purposes, for example.

The switch 102 enables the inverting amplifier 104 to be switched into the circuit, thus causing the meter 114 to display a measurement of the trough of amplitude modulation, instead of the peak, or to display the negative peak deviation of frequency modulation instead of the positive peak deviation. This facility enables the symmetry of the modulation to be assessed.

In order to indicate correct functioning of the system, the circuity includes a multivibrator 120 which drives a light emitting diode 122 under control of an AND gate 124. The diode 122 therefore flashes until the three inputs of the gate 124 are present and then is illuminated continuously.

The first of the gate inputs is taken from a low level detector circuit 126 which monitors the level of the i.f. signal. Only when the input signal level is sufficiently high to enable satisfactory measurement to be made does the low level detector 126 switch on its output to the gate 124.

The second input of the gate 124 is taken from the hunt generator 52 and is held off while the hunt generator 52 is sweeping the oscillator 12 through its frequency range. When the hunt generator 52 ceases operation so as to put the circuitry 28 under control of the integrator 40, then the output from the hunt generator 52 to the gate 124 is switched on.

The third input to the gate 124 is taken from the gain controlled amplifier 66 and is switched on only when the i.f. level is below a predetermined high level.

Therefore, when the input lies above the level set by the detector 126 and below the level set in the amplifier 66, and the frequency control circuit 28 is operating normally, the gate 124 switches off the multivibrator and thus illuminates the diode 122 continuously.

If desired, the circuitry can include means for driving the mixer 8 from an external controllable oscillator instead of the oscillator 12. Switching can be provided to render the local oscillator 12 and its control circuitry inoperative in such cases, and to enable the output of the discriminator 36 to be temporarily displayed on the meter 114 for assisting the tuning of the external oscillator.

Figure 4A:
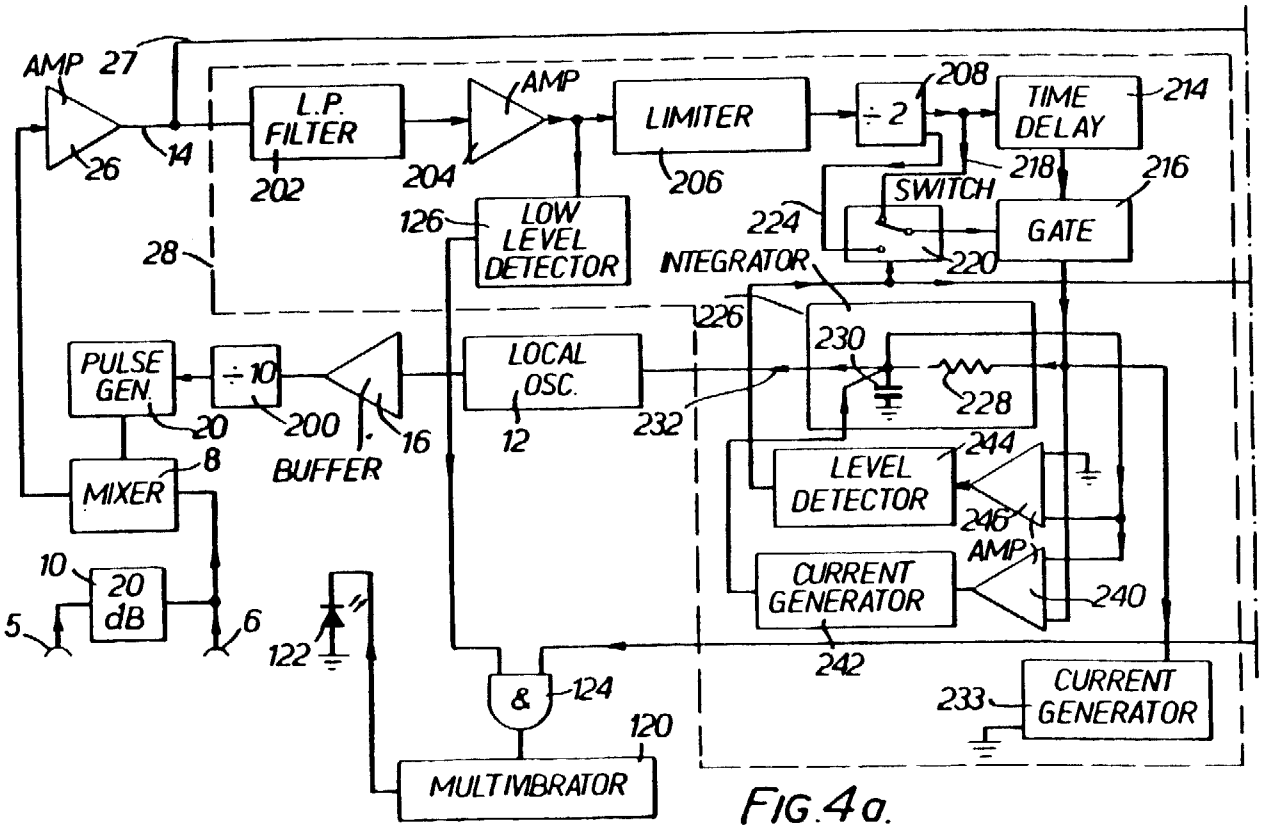
FIGS. 4A & 4B are schematic circuit diagrams of another of the circuit arrangements.
Figure 4B:
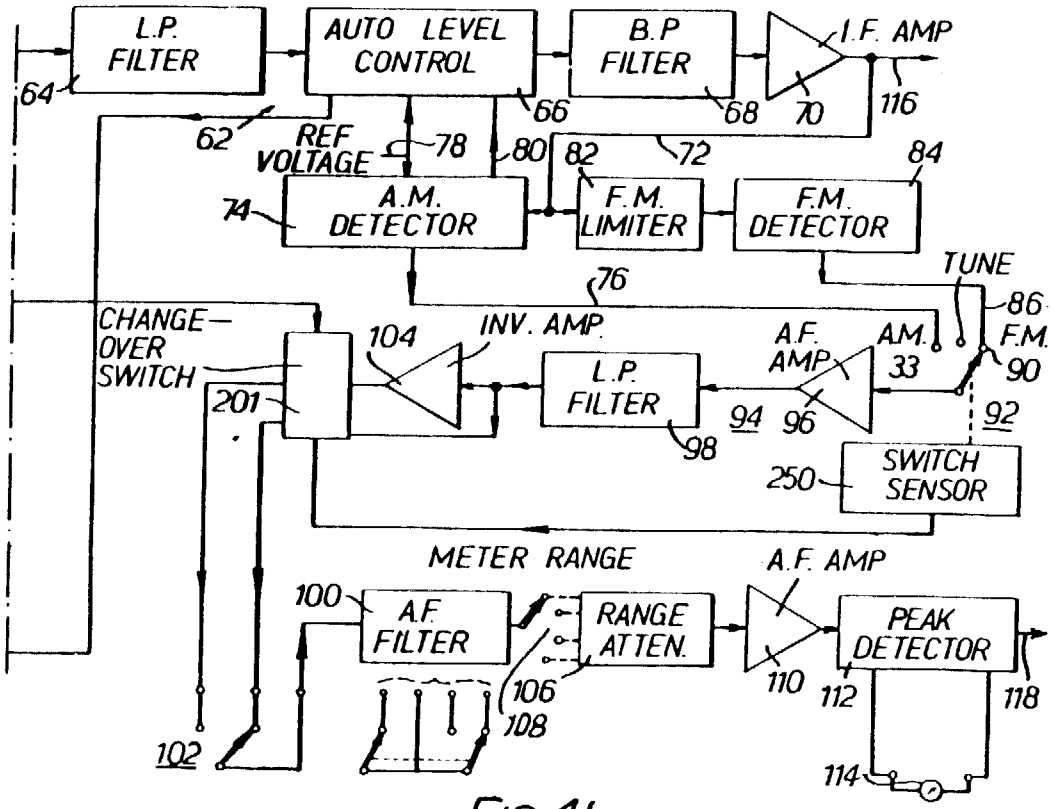

In the circuit arrangement of FIGS. 4A & 4B, parts coresponding to parts in FIG. 1 are similarly referenced. As will be apparent, the circuit arrangement of FIG. 4A differs from that of FIG. 1 in that it uses a divide-by-10 divider 200 instead of the divide-by-two divider 18 of FIG. 1, and also incorporates a change over switch 201 (shown diagrammatically only in FIG. 4B) in the two lines fed to switch 102 of the measuring circuit 94. More importantly, however, the construction and operation of the tuning circuitry 28 differs from that of FIG. 1 as will now be explained in more detail.

As shown in FIG. 4A, the tuning circuitry 28 comprises a low pass filter 202, an amplifier 204, and a limiter 206, which correspond to the filter 30, the amplifier 32, and the limiter 34 of FIG. 1. The ouput of the limiter 206 therefore comprises a rectangular waveform from which amplitude information has been removed. The limiter output is fed into a divide-by-two circuit 208.

Figure 5:
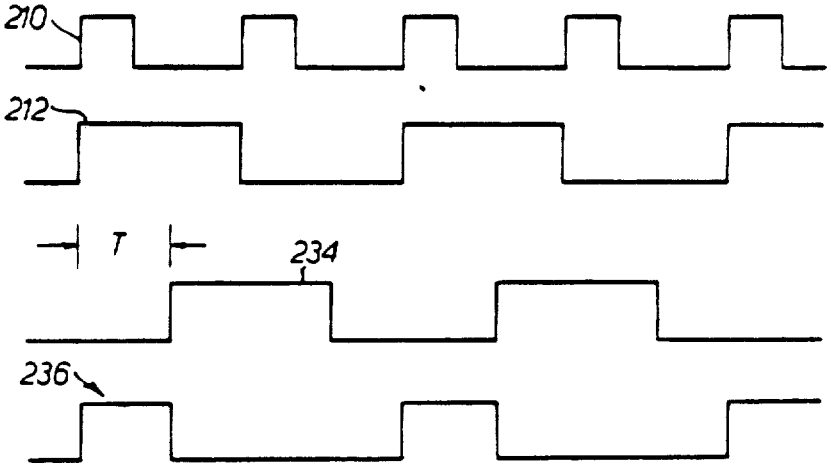
FIG. 5 shows waveforms occurring in the circuit arrangement of FIGS. 4A & 4B.

The purpose of the divider 208 is to convert into a waveform having a 1:1 mark/space ratio any input signal which does not have such a mark/space ratio. For example, waveform 210 in FIG. 5 shows an output from the limiter 208 having a mark/space ratio differing from 1:1. The effect of the divider 208 is to produce the waveform 212 which has the desired mark/space ratio. The divider 208 can be omitted if it is ensured that input signals to be handled always have a 1:1 mark/space ratio.

The output from the divider 208 is then fed into a time delay circuit 214 which delays the signal by a predetermined time and then passes it to one input of a gate 216. In addition, the output of the divider 208 is fed by means of a line 218 to one input of an electronic change-over switch 220 whose operational form is shown diagrammatically for explanation purposes. The second input of the change-over switch 220 is received from the divider 208 on a line 224 and is an inverted version of the signal on the line 218. In cases where the divider 208 is omitted, an inverter would be incorporated to provide the signal on the line 224. The output of the switch 220, which carries the signal on either the input line 218 or the input line 224, according to the setting of the switch, is fed to the second input of the gate 216.

The output of the gate 216 is then fed into an integrator circuit 226. The effective circuit of the integrator 226 consists of a resistor 228 and a capacitor 230, and the output from the integrator is taken across the capacitor on a line 232 and used as a control signal for the local oscillator 12. A discharge circuit consisting of a constant current generator 233 provides a constant current discharge path for the capacitor.

The operation of the tuning circuitry 28 as so far described will now be explained.

As explained in connection with FIG. 1, the purpose of the circuitry 28 is to tune the oscillator 12 so as to maintain the i.f. signal on the line 14 at a constant mean frequency.

Waveform 234 in FIG. 5 shows the output of the time delay circuit 214, the time delay being indicated by T. Assuming that the change-over switch 220 is set in the manner indicated, the gate 216 will therefore receive the waveforms 212 and 234. Gate 216 is operative to produce an output only when the output of the time delay 214 is negative and the output from the switch 220 is positive. Gate 216 will consequently produce a succession of pulses 236 which are thus applied to the integrator circuit 228 and charge up the capacitor 230.

The time delay T of the time delay circuit 214 is so set that, provided the intermediate frequency on the line 14 (and thus the frequency of the waveform 212) is at the desired value, each pulse of the pulse train 236 will occupy a fixed proportion (say, 90°) of each cycle of the repetition frequency of pulse train 236. Therefore, the average charge input into the capacitor 230 will have a predetermined value. Taking into account the fixed discharge current from the capacitor 230, therefore, the result is that there will be produced on the line 232 a d.c. level which will hold the output frequency of the oscillator 12 constant at a frequency which produces the desired intermediate frequency on the line 14.

If any change in the value of the intermediate frequency takes place (as a result, for example, of a change in the input frequency of the circuit arrangement), then the frequency of the pulses 236 will increase or decrease correspondingly. The result will be that the mean charge fed into the capacitor 230 will increase or decrease and produce an integrated error signal in the form of a change in the d.c. level on the line 232 which will adjust the output frequency oscillator 12 in such a direction as to bring the intermediate frequency on the line 14 back to the predetermined value. The output frequency of the oscillator 12 will therefore change correspondingly and in a direction such as to bring the intermediate frequency on the line 14 back to the desired value.

As with the tuning circuitry 28 of FIG. 1, the action of the integrator 226 is such that the circuitry cannot follow rapid changes in the frequency of the input due to frequency modulation, and the f.m. information is therefore not removed and exists on the line 27.

In order to improve the response to the circuitry 28 to the condition when the intermediate frequency is substantially different from the desired value, the system includes a differential d.c. amplifier 240 which is connected to measure the voltage developed across the resistor 228 which is in turn dependent on the control action being exerted on the local oscillator.

The amplifier 240 has a high input impedance so as to avoid imposing substantially any current loading on the integrator circuit.

The output of the amplifier 240 is therefore a second error signal that controls a current generator 242 which feeds additional or augmenting charge into the capacitor 230 in dependence on the magnitude of the control action being exerted on the oscillator 12 by the integrator circuit. The result is that the control action exerted on the oscillator 12 is given a non-linear characteristic, with the additional current from the current generator 242 being large when the d.c. output from the gate 216 is demanding a large change in oscillator frequency and reducing as the demanded change decreases.

It will be appreciated that the amplifier 240 and the current generator 242 are particularly effective when an input signal is first applied to the circuit arrangement if its value is such that initially the intermediate frequency produced by the mixer 8 on the line 14 is substantially different from the desired value.

The tuning circuitry 28 also includes a level detector circuit 244 which is responsive to the output of an amplifier 246. When the level detector circuit 244 detects that the voltage on the line 232 (as received via amplifier 246) is such that the integrator output is reaching a predetermined upper or lower limit, it changes over the setting of the switch 220. The result is that waveform 212 in FIG. 5 becomes inverted. The control action therefore reverses. Thus, if the integrator output is approaching the upper or lower limit due for example to the oscillator output having overshot the control point or to a change in the frequency of the input signal, the reverse control action enables the integrator to reassume control. Change over of the switch 220 produces a 180° phase shift in the signal on the line 27. In order to compensate for this, the changeover switch 201 is also operated by the signal from the level detector 244 but only provided that a sensor 250 detects that the switch 92 is set to select frequency modulation. If the switch 92 is set to select amplitude modulation, the sensor 250 prevents switch 201 from changing over, since such change over is not required.

The remainder of the circuit of FIG. 4B and its operation are the same as described and illustrated with respect to FIGS. 1 to 3 and will not be further described.

The tuning circuitry 28 of FIG. 4A is particularly advantageous where the input applied to the circuit arrangement comprises more than one signal at different levels and different frequencies. The tuning circuitry 28 of FIG. 4A is better able to select the correct (that is, the largest) input signal in such a case than is the tuning circuitry 28 of FIG. 1.

Power supplies for the circuit arrangements are not shown but can be taken from a mains supply unit and/or from a battery supply which may be provided with its own charging arrangement.

What is claimed is:

1. An electrical circuit arrangement responsive to an input signal whose frequency can vary within a first predetermined range and for converting the input signal to a predetermined frequency, comprising a variable frequency source producing a variable frequency signal variable over a second predetermined range, mixing means for mixing the input signal with the variable frequency signal so as to produce an intermediate signal whose frequency varies with the two mixed frequencies so as to maintain a predetermined algebraic relationship with the two mixed frequencies as they vary over their said ranges, discriminator means responsive to the frequency of the intermediate signal as the input signal and the variable frequency signal vary over their respective said ranges, and operative to produce a control signal whose magnitude is dependent on the frequency of the intermediate signal, a reference [a] signal source, integrator means for receiving the control signal and the reference signal so as to produce an integrated error signal which is dependent on the difference therebetween, means responsive to the magnitude of said integrated error signal to produce a second error signal whose value is dependent on the value of said integrated error signal, means coupled to said integrator means *and responsive to the second error signal* for increasing the rate at which the mean frequency of the intermediate signal is brought to the value represented by the reference magnitude, and means for feeding the integrated error signal to the variable frequency source to control the frequency of the variable frequency source in such a direction as to bring the mean frequency of the said intermediate signal to a predetermined value represented by the magnitude of the reference signal[.] *the mixing means comprising sampling means operative under control of and in synchronism with the variable frequency signal to repeatedly sample the instantaneous amplitude of the input signal, whereby the said intermediate signal has a frequency dependent on the difference between the frequency of the input signal and a multiple of the variable frequency.*

[2. A circuit arrangement according to claim 1, in which the mixing means comprises sampling means operative under control of and in synchronism with the variable frequency signal to repeatedly sample the instantaneous amplitude of the input signal, whereby the said intermediate signal has a frequency dependent on the difference between the frequency of the input signal and a multiple of the variable frequency.]

[3. A circuit arrangement according to claim 1, including means responsive to the magnitude of the control signal and of the reference signal to produce a second error signal when the difference therebetween lies outside a predetermined range, sweep control means operative, when activated, to generate a frequency sweeping signal means feeding the second error signal to activate the sweep control means, and means feeding the frequency sweeping signal to render the integrator means unresponsive to the said control signal and to sweep the frequency of the intermediate signal until the mean frequency of the intermediate signal approaches the predetermined value.]

4. A circuit arrangement according to claim 1, in which the integrator means comprises capacitive means connected to be charged in response to the magnitude of the control signal and to be discharged at a rate dependent on the value of the reference signal.

5. A circuit arrangement according to claim 1, further comprises a modulation measurement circuit arrangement for measuring the degree of amplitude or frequency modulation of said input signal, said input signal being a modulated signal, said modulation measurement circuit arrangement comprising means responsive to the intermediate signal and to a predetermined reference level to control the mean level of the intermediate signal to be substantially constant at a predetermined value, and means operative to measure the instantaneous amplitude or frequency variations of the so-controlled intermediate signal due to the modulation to be measured.

6. A circuit arrangement according to claim 1, in which the discriminator means comprises means for producing from the intermediate signal a rectangular signal having a rectangular waveform of frequency dependent on the frequency of the intermediate signal and of predetermined amplitude, means for applying a fixed predetermined time delay to the said rectangular signal, and comparing means for comparing the instantaneous amplitudes of the said rectangular signal and the said rectangular signal after the said time delay whereby to produce as the said control signal a succession of pulses whose mean level is dependent on the value of the frequency of the said intermediate signal.

7. A circuit arrangement according to claim 6, including means responsive to the magnitude of the integrated error signal and operative to detect when the magnitude of the integrated error signal falls outside a predetermined range of values to invert one of the two signals applied to the comparing means and thereby reverse the direction of change of the said error signal.

8. A modulation measuring circuit arrangement for measuring the degree of amplitude or frequency modulation of a modulated input signal variable in carrier frequency over a first predetermined range, comprising a controllable oscillator producing an output variable in frequency over a second predetermined range, mixing means connected to receive the input signal and the oscillator output to produce an intermediate signal whose frequency is dependent on the difference between the frequencies of the input signal and of of the oscillator, means responsive to the intermediate signal to control its mean level to be substantially constant but to preserve therein amplitude modulation corresponding to the amplitude modulation in the input signal, discriminating means responsive to the frequency of the said intermediate signal as the frequencies of the input signal and oscillator output vary over their said ranges, and operative to produce a control signal of corresponding magnitude, a reference signal source producing a reference signal representing a predetermined mean frequency, integrator means connected to compare the magnitude of the said control signal with the magnitude of the reference signal and thereby to produce an integrated error signal dependent on the difference between the two signals compared, means [responsive to] *for feeding* the *integrated* error signal *to the controllable frequency oscillator* to control the oscillator frequency such as to maintain the mean frequency of the said intermediate signal at the predetermined mean frequency but to preserve in the intermediate signal the frequency modulation in the input signal, and means operative to measure the envelope amplitude or frequency variations of the intermediate signal due to the modulation to be measured[.] *the frequency mixing means comprising sampling means operative under control of the oscillator output to repeatedly sample the instantaneous amplitude of the input signal, whereby the said intermediate signal has a frequency dependent on the difference between the frequency of the input signal and a multiple of the variable frequency.*

[9. A circuit arrangement according to claim 8, in which the frequency mixing means comprises sampling means operative under control of the oscillator output to repeatedly sample the instantaneous amplitude of the input signal, whereby the said intermediate signal has a frequency dependent on the difference between the frequency of the input signal and a multiple of the oscillator frequency.]

10. A circuit arrangement according to claim 8, in which the means to control the mean level of the intermediate signal to be substantially constant comprises a controllable gain amplifier connected to receive the intermediate signal, and means responsive to the output of the controllable gain amplifier to determine the variations if any in the mean level thereof and to adjust the gain of the said amplifier in a direction tending to offset the said variations but not to affect the variations due to the amplitude modulation.

11. A modulation measurement circuit arrangement responsive to an input signal for measuring the degree of amplitude and frequency modulation thereof, comprising a controllable-frequency oscillator, a sampling mixer connected to receive the input signal and operative at a frequency determined by the controllable frequency oscillator to repeatedly sample and temporarily store the amplitude of the input signal whereby to produce an intermediate signal having a mean frequency dependent on the difference between the frequency of the input signal and some multiple of the frequency of the oscillator, means producing a reference signal representing a predetermined frequency, means for comparing the mean frequency of the said intermediate signal with the reference signal whereby to produce a first error signal, means responsive to the error signal to adjust the frequency of the oscillator in such a direction as to tend to hold the mean value of the frequency of the intermediate signal at the predetermined frequency while preserving therein variations in amplitude and frequency due to amplitude and frequency modulation, means responsive to the controlled intermediate signal from the mixer to detect changes in its mean level from a predetermined reference level whereby to produce a second error signal, level changing means responsive to the second error signal to adjust the mean level of the intermediate signal from the mixer in a direction tending to reduce the second error signal to zero whereby to produce an output signal whose mean frequency and level are substantially constant at predetermined values but in which are preserved the amplitude and frequency variations due to amplitude and frequency modulation in the input signal, and selectively controllable measuring means for detecting the amplitude or frequency modulation in the output signal and measuring the levels thereof.

12. A circuit arrangement according to claim 11, including means for inverting the detected modulation so as to enable the degree of modulation on either side of a mean value to be measured.

*13. A circuit arrangement according to claim 8, including*

*means responsive to the magnitude of the control signal and of the reference signal to produce a second error signal when the difference therebetween lies outside a predetermined range,*

*sweep control means operative, when activated, to generate a frequency sweeping signal,*

*means feeding the second error signal to activate the sweep control means, and*

*means feeding the frequency sweeping signal to cause the integrator means to sweep the oscillator frequency until the mean frequency of the intermediate signal approaches the predetermined frequency.*

*14. A circuit arrangement according to claim 13, including*

*means responsive to the magnitude of the integrated error signal to produce a third error signal when the value of the integrated error signal lies outside a predetermined range, and*

*means feeding the third error signal to activate the sweep control means.*

*15. A circuit arrangement according to claim 8, including*

*means responsive to the magnitude of the integrated error signal to produce a second error signal whose value is dependent on the value of said integrated error signal, and*

*means feeding the said second error signal to said integrator means for augmenting the value of the said integrated error signal and increasing the rate at which the mean frequency of the intermediate signal is brought to the value represented by the reference signal.*

*16. A modulation measurement circuit arrangement responsive to an input signal whose carrier frequency can vary over a first predetermined range for measuring the degree of amplitude or frequency modulation thereof, comprising*

*a controllable-frequency oscillator producing an output variable in frequency over a second predetermined range,*

*a sampling mixer connected to receive the input signal and operative at a frequency determined by the controllable-frequency oscillator to repeatedly sample and temporarily store the amplitude of the input signal whereby to produce an intermediate signal whose frequency is the difference between the input signal frequency and the frequency of one of the harmonics of the frequency of the oscillator,*

*discriminating means responsive to the frequency of the intermediate signal as the frequencies of the input signal and the oscillator output vary over their respective said ranges, and operative to produce a control signal whose magnitude is dependent on the frequency of the intermediate signal,*

*a reference signal source producing a reference signal representing a predetermined mean frequency value lying within predetermined limits,*

*integrator means connected to receive the control signal and operative when the mean frequency of the intermediate signal lies within the said predetermined limits to compare the magnitude of the control signal with the magnitude of the reference signal and thereby to produce an integrated frequency error signal dependent on the difference between the two signals compared,*

*means for feeding the integrated frequency error signal to the controllable frequency oscillator to adjust the frequency of the oscillator in such a direction as to tend to hold the mean value of the frequency of the intermediate signal at the predetermined frequency value while preserving therein variations in amplitude and frequency due to amplitude and frequency modulation,*

*sweep control means coupled to said integrator means for causing it to sweep the frequency of the oscillator over the said second predetermined range,*

*means responsive to the control signal from the discriminating means for maintaining the sweep control means operative to sweep the frequency of the oscillator over the said range of values when the frequency of the intermediate signal lies outside the said limits and for preventing its operation when the frequency of the intermediate signal lies inside the said limits,*

*means responsive to the intermediate signal from the mixer to detect changes in its mean level from a predetermined reference level whereby to produce a level error signal,*

*level changing means responsive to the level error signal to adjust the mean level of the intermediate signal from the mixer in a direction tending to reduce the level error signal to zero whereby to produce an output signal whose mean frequency and level are substantially constant at predetermined values but in which are preserved the amplitude and frequency variations due to amplitude and frequency modulation in the input signal, and*

*selectively controllable measuring means for detecting the amplitude or frequency modulation in the output signal and measuring the levels thereof.*

*17. A modulation measurement circuit arrangement responsive to an input signal whose carrier frequency can vary over a first predetermined range for measuring the degree of amplitude or frequency modulation thereof, comprising*

*a controllable-frequency oscillator producing an output variable in frequency over a second predetermined range,*

*a sampling mixer connected to receive the input signal and operative at a frequency determined by the controllable-frequency oscillator to repeatedly sample and temporarily store the amplitude of the input sig-*

*nal whereby to produce an intermediate signal whose frequency is the difference between the input signal frequency and the frequency of one of the harmonics of the frequency of the oscillator.*

*discriminating means responsive to the frequency of the said intermediate signal as the frequencies of the input signal and the oscillator output vary over their said ranges and operative to produce a control signal of corresponding magnitude.*

*a reference signal source producing a reference signal representing a predetermined mean frequency value.*

*integrator means connected to compare the magnitude of the said control signal with the magnitude of the reference signal and thereby to produce an integrated frequency error signal dependent on the difference between the two signals compared.*

*means for feeding the integrated frequency error signal to the controllable frequency oscillator to adjust the frequency of the oscillator in such a direction as to tend to hold the mean value of the frequency of the intermediate signal at the predetermined frequency value while preserving therein variations in amplitude and frequency due to amplitude and frequency modulation.*

*means for augmenting the value of the frequency error signal so as to increase the rate at which the mean frequency of the intermediate signal is brought to the predetermined frequency.*

*means responsive to the control signal from the discriminating means for maintaining the augmenting means operative when the frequency of the intermediate signal lies outside predetermined limits and for preventing its operation when the frequency of the intermediate signal lies inside the said limits.*

*means responsive to the intermediate signal from the mixer to detect changes in its mean level from a predetermined reference level whereby to produce a level error signal.*

*level changing means responsive to the level error signal to adjust the mean level of the intermediate signal from the mixer in a direction tending to reduce the level error signal to zero whereby to produce an output signal whose mean frequency and level are substantially constant at predetermined values but in which are preserved the amplitude and frequency variations due to amplitude and frequency modulation in the input signal, and*

*selectively controllable measuring means for detecting the amplitude or frequency modulation in the output signal and measuring the levels thereof.*

* * * * *